(12) United States Patent
Yang

(10) Patent No.: US 6,352,868 B1
(45) Date of Patent: Mar. 5, 2002

(54) METHOD AND APPARATUS FOR WAFER LEVEL BURN-IN

(76) Inventor: Wen-Kun Yang, No. 47. Lane 6, An-Kang Street, Hsinchu City (TW)

(*) Notice: Subject to any disclaimer, the term of this patent is extended or adjusted under 35 U.S.C. 154(b) by 0 days.

(21) Appl. No.: 09/524,421

(22) Filed: Mar. 11, 2000

(30) Foreign Application Priority Data

Jan. 9, 2000 (TW) .......................................... 89100834

(51) Int. Cl.⁷ .......................... G01R 31/26; H01L 21/66
(52) U.S. Cl. .......................... 438/14; 438/14; 438/238; 438/239; 257/296; 365/201
(58) Field of Search ................... 438/15, 14, 128–29, 438/238–56, 974; 257/204, 296; 365/201

(56) References Cited

U.S. PATENT DOCUMENTS

| | | | | |
|---|---|---|---|---|
| 5,276,647 A | * | 1/1994 | Matsui et al. ................ | 365/201 |
| 5,375,093 A | * | 12/1994 | Hirano ........................ | 365/222 |
| 5,381,373 A | * | 1/1995 | Ohsawa ....................... | 365/201 |
| 5,614,837 A | * | 3/1997 | Itoyama et al. .............. | 324/760 |
| 5,636,171 A | * | 6/1997 | Yoo et al. .................... | 365/222 |
| 5,638,331 A | * | 6/1997 | Cha et al. .................... | 365/201 |
| 5,642,316 A | * | 6/1997 | Tran et al. ................... | 365/200 |
| 5,654,930 A | * | 8/1997 | Yoo et al. .................... | 365/222 |
| 5,726,930 A | * | 3/1998 | Hasegawa et al. ........... | 365/145 |
| 6,067,261 A | * | 8/1998 | Vogelsang et al. ........... | 365/201 |
| 6,055,199 A | * | 10/1998 | Hamade et al. .............. | 365/201 |
| 5,838,163 A | * | 11/1998 | Rostoker et al. ............. | 324/763 |
| 6,233,185 B1 | * | 2/1999 | Beffa et al. .................. | 365/201 |
| 5,898,629 A | * | 4/1999 | Beffa et al. .................. | 365/201 |
| 6,038,183 A | * | 4/1999 | Tsukude ...................... | 365/201 |
| 6,169,694 B1 | * | 5/1999 | Nam et al. ................... | 365/201 |
| 5,949,731 A | * | 9/1999 | Tsukude ................ | 365/230.01 |
| 5,995,428 A | * | 11/1999 | Chien et al. ................. | 365/201 |
| 6,266,286 B1 | * | 12/1999 | Cho et al. .................... | 365/201 |
| 6,205,067 B1 | * | 1/2000 | Tsukude ...................... | 365/201 |
| 6,065,143 A | * | 5/2000 | Yamasaki et al. ........... | 714/720 |

* cited by examiner

*Primary Examiner*—Matthew Smith
*Assistant Examiner*—Granvill D. Lee, Jr.

(57) ABSTRACT

A built-in circuit for wafer level burn-in of a die. The burn-in circuit includes a main burn-in control circuit, a word line control circuit and a bit line control circuit. A number of internal probing pads are also provided to receive voltages for stressing a gate oxide or capacitor oxide layer. A burn-in test system has a plurality of programmable power suppliers and programmable relays for providing control and power signals to a membrane or micro spring probe card used for the wafer level burn-in of multiple dice at the same time. Wafers are loaded and aligned in a prober with an automatic probing station and a hot chuck for the burn-in. The wafer level burn-in reduces the burn-in time of an integrated circuit chip from several days to several minutes.

17 Claims, 11 Drawing Sheets

METHOD AND APPARATUS FOR WAFER LEVEL BURN-IN

FIELD OF THE INVENTION

The present invention relates generally to a method and apparatus for integrated circuit burn-in, and more specifically to a method and apparatus for wafer level burn-in before dice are packaged into individual circuit chips.

BACKGROUND OF THE INVENTION

The advance of semiconductor technology in recent years has greatly increased the density of a semiconductor device. In order to satisfy the strong market demand of highly portable and compact electronic gadgets, many semiconductor manufacturers are dedicated to the fabrication of integrated circuits with densely populated semiconductor devices, a large number of input/output (I/O) terminals and fast processing speed. After the fabrication of integrated circuits on a wafer, each die on the wafer needs to be properly tested and packaged to prevent it from being damaged by moisture or external forces.

As the number of I/O pins and the processing speed of a circuit device increase, the technology of packaging the die becomes more and more critical. How to package a large number of pins in a small volume and maintain the high processing speed of the device have to be carefully considered. In addition, the issue of heat dissipation from the high density circuit must be addressed. After each die is packaged, the circuit on the die has to be tested to ensure that it functions properly as designed.

One important step in the conventional test procedures is burn-in. In the conventional packaging technology, a wafer is first sawed and dice are cut from the wafer for packaging. Each die is sealed and packaged as an integrated circuit chip in a package such as TSOP, SOJ, QFP and BGA, . . . , etc. The integrated circuit is then under burn-in on a test socket separately. Different test sockets are required for the burn-in of the devices that have different types of packages. The purpose of the burn-in process is to identify and remove the devices that suffer from infant mortality.

With the conventional technology, the process of burn-in usually takes 8 to 96 hours and requires a specific burn-in system for a given integrated circuit chip. The technology relies on a burn-in system that sends signals to directly control the integrated circuit. During a test cycle, 50% of the duty cycle is used and only one address bit can be controlled. Most of the test uses write cycle only. Because of the inefficiency, a packaged integrated circuit spends a long time on a burn-in board between loading and off-loading.

There are other drawbacks in the conventional burn-in technology. The pins of the circuit sometimes are bent to cause a problem. Both the burn-in boards and the socket have short life. In addition, if wafer process results in defects found in the packaged integrated circuit under burn-in, the problem is uncovered only after many integrated circuits have been packaged and many wafers have been manufactured. Therefore, there is a strong demand in having a better burn-in technology that can uncover the defects and reflect the wafer process problem as early as possible to reduce the cost and risk.

SUMMARY OF THE INVENTION

The present invention has been made to overcome the above-mentioned drawbacks of conventional techniques for the burn-in of integrated circuit chips. The primary object of the invention is to reduce the time required in the burn-in. Accordingly, a method of wafer level burn-in before dice are packaged is provided to speed up the burn-in process and reduce the burn-in time.

Another object of the invention is to provide a burn-in circuit that can be built in an integrated circuit to facilitate the wafer level burn-in method. The built-in burn-in circuit of the invention comprises a main burn-in control circuit, a word-line control circuit and a bit-line control circuit. In addition, internal probing pads are also built in the integrated circuit for providing voltages required to stress the gate oxide or capacitor oxide of a memory cell.

It is also an object of the invention to provide a burn-in test system for the wafer level burn-in of integrated chips. The burn-in test system comprises a plurality of programmable power suppliers and a plurality of programmable relays for providing voltages and control signals for the wafer level burn-in of integrated circuit chips. Control pins provide control signals to all dice under burn-in. Power pins provide voltage signals to each individual die. Each die can be turned on or off separately according to the requirement.

It is yet another object of the invention to provide a wafer level burn-in system comprising a PC, a burn-in test system, a membrane or micro spring probe card and a prober. According to the invention, the burn-in test system is controlled by the PC that provides user interface. The prober provides an automatic station with a hot chuck. The membrane or micro spring probe card connected to the burn-in test system is used to perform the burn-in of a die. Wafers are automatically loaded and aligned by the prober before the burn-in starts.

The foregoing and other objects, features, aspects and advantages of the present invention will become more apparent from a careful reading of a detailed description provided herein below, with appropriate reference to the accompanying drawings.

DETAILED DESCRIPTION OF THE PREFERRED EMBODIMENTS

Based on the electro-physics characteristics of an integrated circuit device, the present invention uses high voltage stress and high temperature to detect devices that may suffer from infant mortality. The integrated circuits that pass the burn-in, thus, have better reliability and quality.

Figure 1:
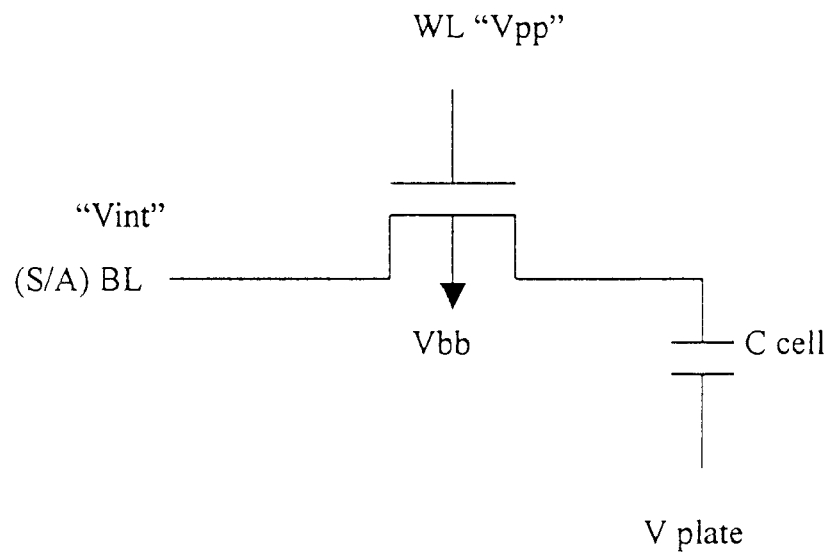
FIG. 1 illustrates the basic structure of a dynamic random access memory cell.

FIG. 1 shows a circuit diagram of a dynamic random access memory (DRAM) including a MOS transistor and a capacitor. The MOS transistor has a gate connected to a word line, a source connected to a bit line and a drain connected to the first end of the capacitor. The second end of the capacitor is connected to Vplate. The operational principle of a memory cell is well known and will not be described.

The gate oxide of a memory cell is regarded as the weakest area in the memory device because the gate has to withstand the highest voltage. In addition, a thin oxide (Ox) layer has been used to replace an ONO layer in the device. Consequently, most of defects occur i n this gate oxide area due to the high voltage that may damage the gate oxide. The purpose of burn-in is to stress a device so that a potentially defective device can be detected. The block diagram of a preferred embodiment of the present invention for the burn-in test of a DRAM is illustrated in FIG. 2.

Figure 2:
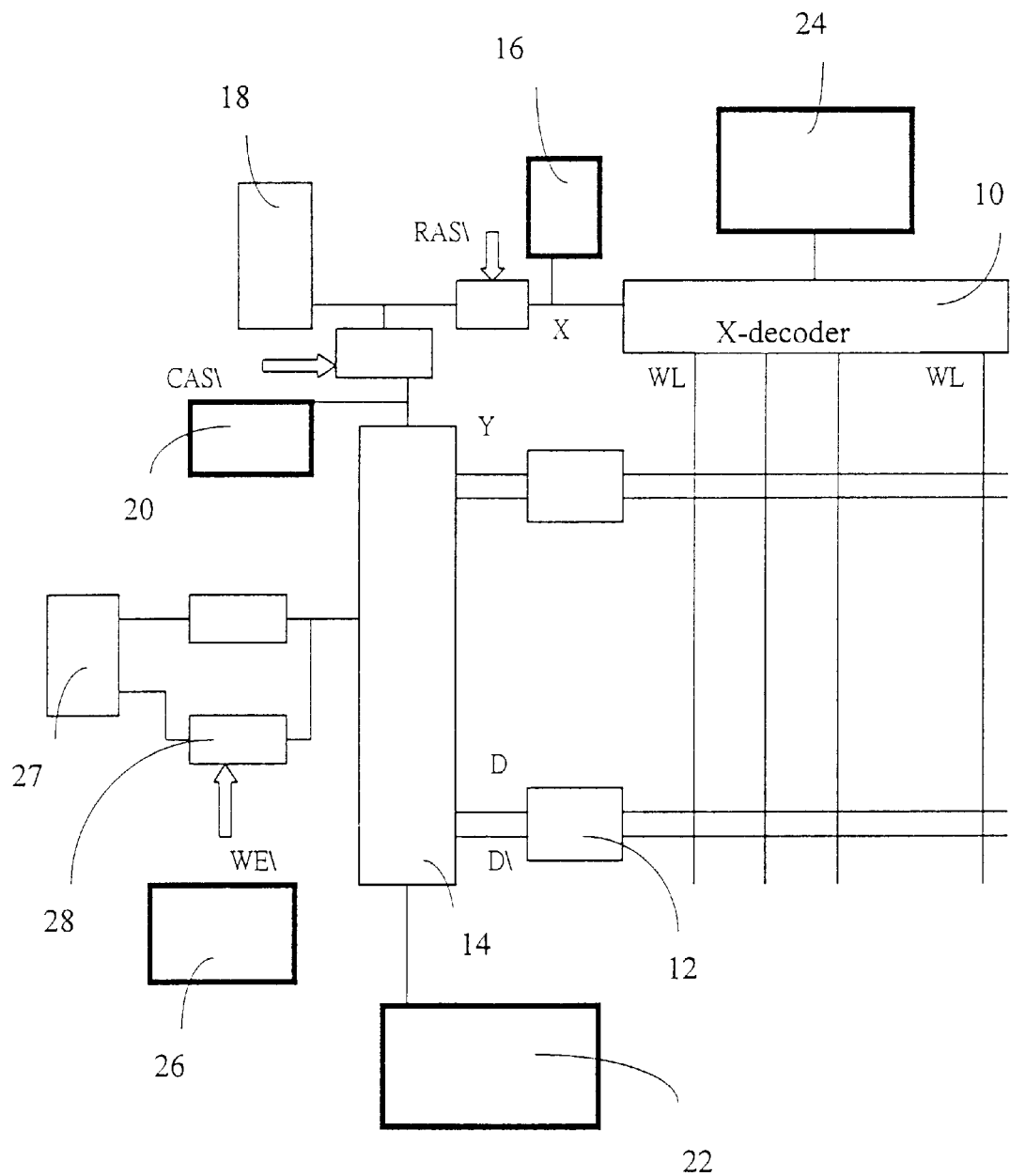
FIG. 2 illustrates the block diagram of a burn-in circuit that is built in a memory array according to the present invention.

As shown in FIG. 2, a DRAM array includes a plurality of word lines and a plurality of bit lines. The word lines are connected to an X-decoder 10. The bit lines are connected to a Y-decoder 14 through sense amplifiers 12. The input signals select a desired word line or bit line through the X-decoder 10 and the Y-decoder 14. An X-counter 16 is connected to the X-decoder 10. A Y-counter 20 is connected to the Y-decoder 14. Although a separate X-counter 16 is shown in FIG. 2, it can be an internal X refresh counter in the X-decoder 10. Similarly, an internal Y counter in the Y-decoder 14 can be the Y-counter 20. When a control pad Yic is pulled high, the Y-counter 20 is triggered.

An address pad 18 connects to the X-decoder 10 and Y-decoder 14 through a row address strobe and a column address strobe respectively. Input pins RAS\ and CAS\ control the row address strobe and the column address strobe respectively. A word line burn-in control circuit 24 is connected to the X-decoder 10 to control the word lines for the burn-in process. A bit line burn-in control circuit 22 is connected to the Y-decoder 14 to control the bit lines for the burn-in process. A burn-in main control circuit 26 controls the burn-in of the memory cells. An I/O interface 27 communicates with the Y-decoder 14 through the input buffer 28 or the output buffer 29.

Figure 2A:
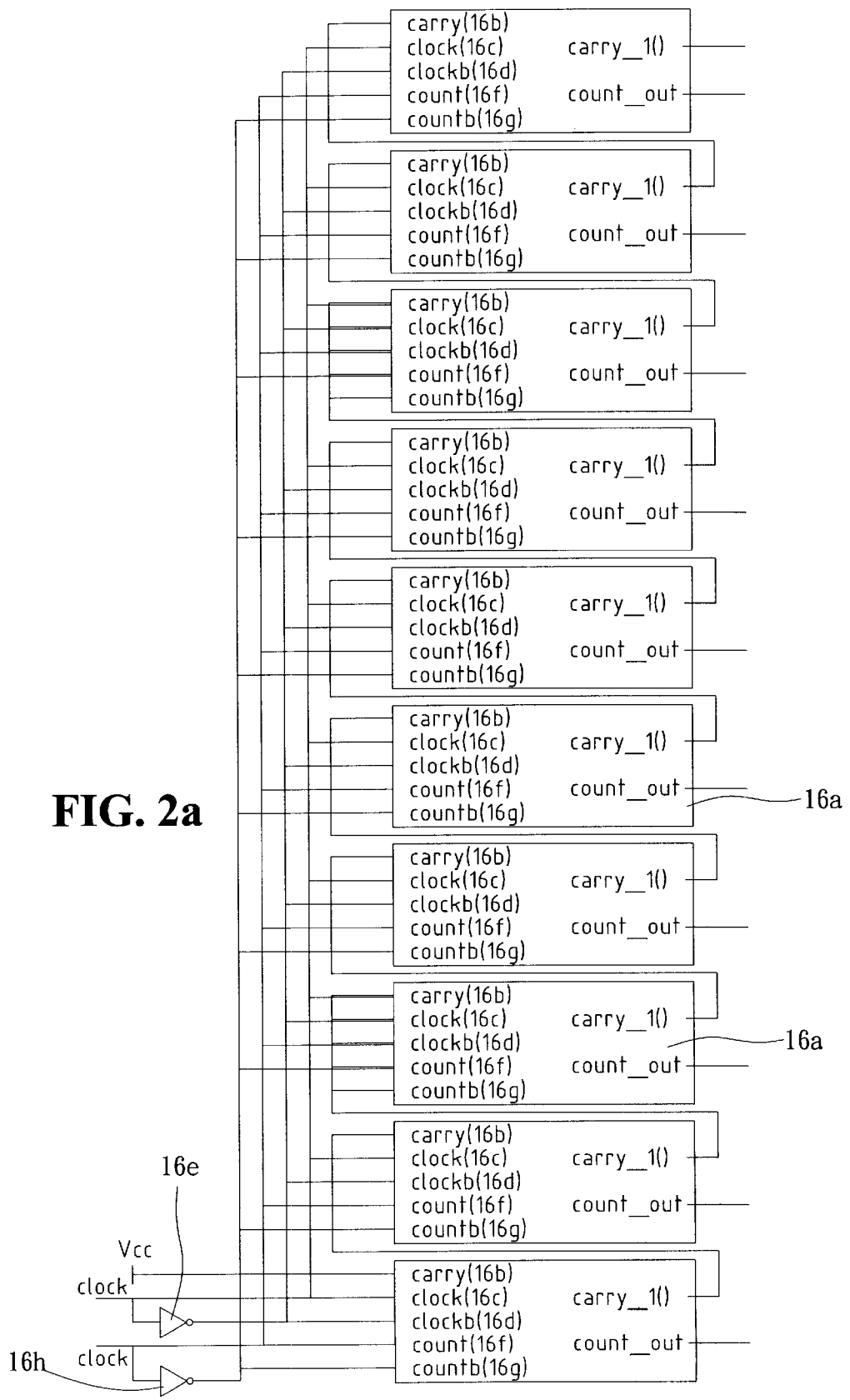
FIG. 2a illustrates an example of the counter circuit for the internal refresh X counter or Y counter used in the burn-in circuit according to the present invention.
Figure 2B:
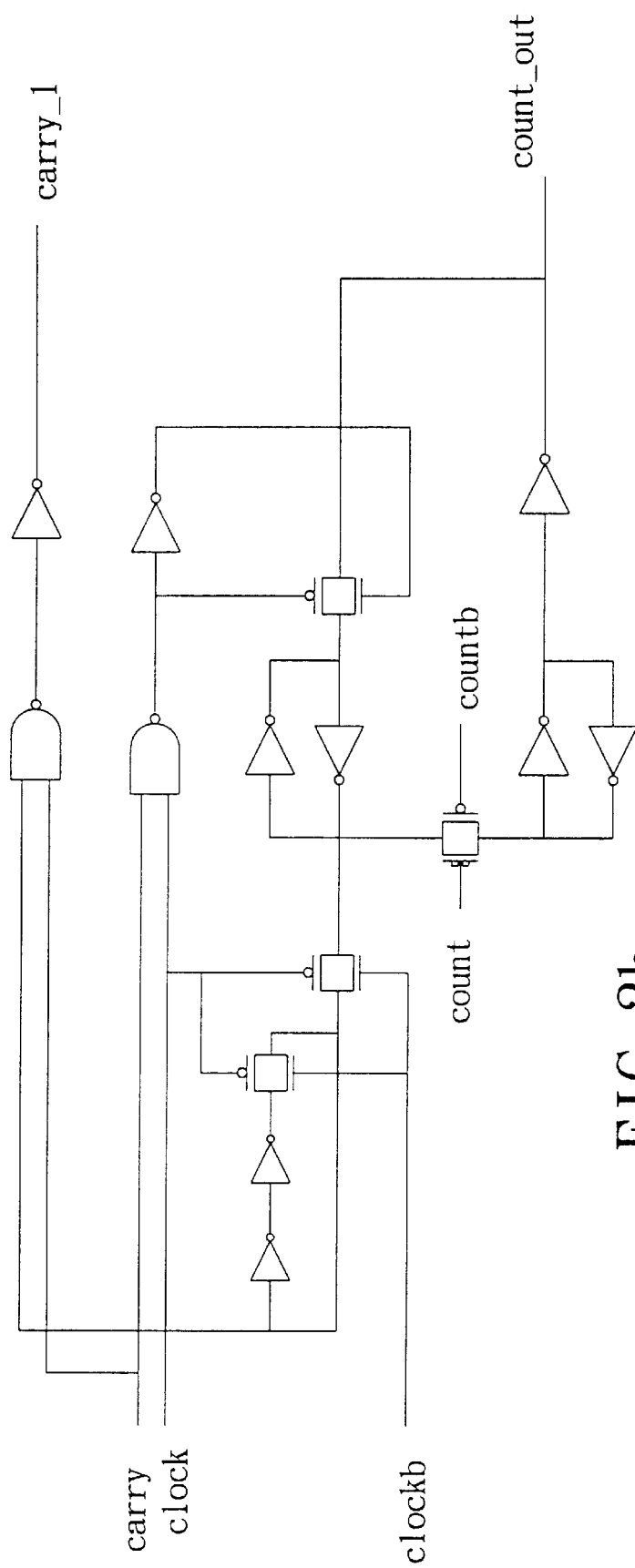
FIG. 2b illustrates an implementation of the circuit of a counter.

FIG. 2a shows an example of the counter circuit for the X-counter 16 or the Y-counter 20 according to the invention. The counter circuit comprises a plurality of counters 16a connected in series. The input pin to the carry input 16b of the first counter is connected to a power supply voltage Vcc. A timing clock signal is connected to the clock input 16c. The timing signal is also sent to the clockb input 16d through an inverter 16e. A count signal is connected to the count input 16f of the first counter. The count signal is also sent to the countb input 16g of the first counter. The carry_1 output of the first counter is connected to the carry input 16b of the second counter. The carry_out output is the least significant bit output of the counter circuit. The connection of the other counters can be easily understood from FIG. 2a. FIG. 2b shows a circuit diagram for an implementation of a counter.

The word line burn-in control circuit 24 controls the burn-in of the gate oxide of a memory cell. External voltages are applied to the internal probing pads Vpp and Vbb shown in FIG. 1 to stress the gate oxide. The voltage applied must be less than the breakdown voltage of the gate oxide layer. The word line burn-in control circuit 24 can turn on all word lines at the same time and stress all gate oxides of the bit lines simultaneously. An external test system can apply voltages through the internal probing pads to turn on/off the gate. The stress time can be controlled by the external system by means of the control pad WL. During burn-in, Vcc is at a high limit voltage, RAS\, CAS\, BI and WL are at a high state, and Vpp and Vbb are at program values. The other pins are at a low state.

Figure 2C:
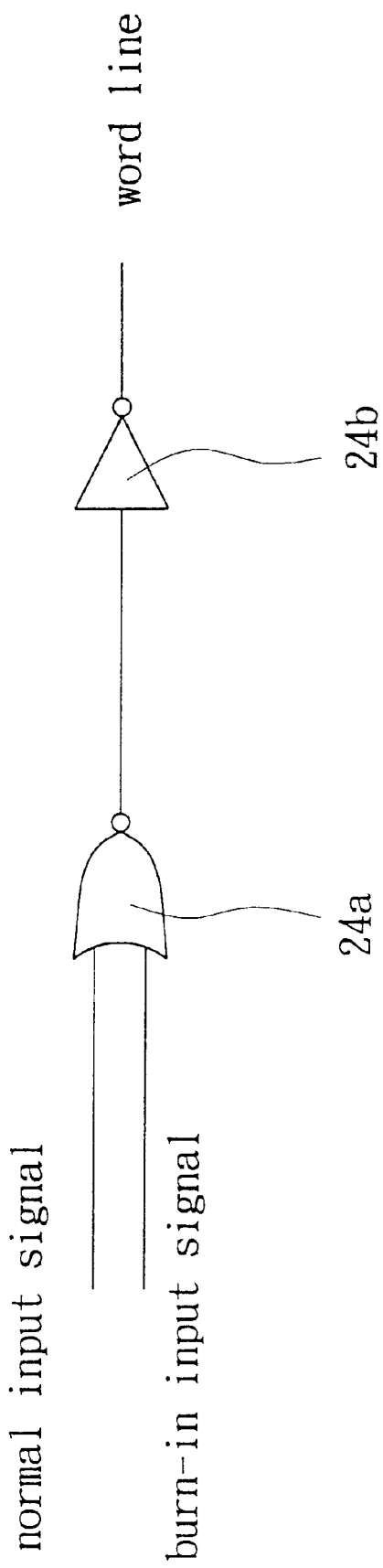
FIG. 2c illustrates an implementation of the circuit for the word-line burn-in control circuit according to the present invention.

FIG. 2c is an example of the word line burn-in control circuit 24 according to the invention. Only the circuit of controlling a word line is shown. A NOR gate 24a accepts a normal input signal and a burn-in input signal. The output of the NOR gate 24a is connected to an inverter 24b. The output of the inverter 24b is sent to the word line.

The bit line burn-in control circuit 22 controls the burn-in of the oxide of the capacitor of a memory cell. External voltages are applied to the internal probing pads Vint and Vplate shown in FIG. 1 to stress the capacitor oxide. The voltage applied must be less than the breakdown voltage of the capacitor oxide layer. An external test system can turn on the burn-in control circuit 22 through the control pad BL.

Figure 3:
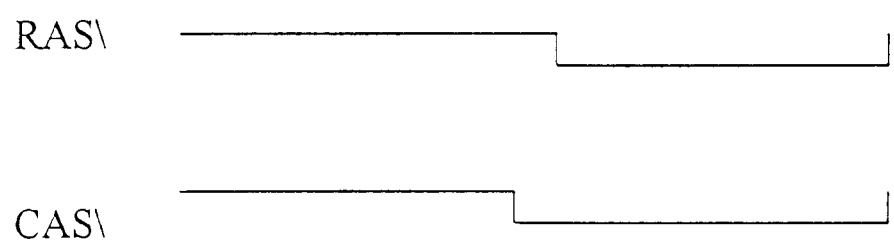
FIG. 3 illustrates the timing diagram of control signals RAS\ and CAS\.

As can be seen from the timing diagram shown in FIG. 3. CAS\ comes before RAS\. The internal X refresh counter inside the X-decoder turns on one word line at a time so that the bits on the word line can be stressed. When the internal X refresh counter finishes counting once, it also means that all the bits have been stressed. During burn-in, Vcc is at a high limit voltage, BI is at high state, WL is at a low state, Vpp and Vbb are at a tri-state value, BL is at a high state, Vint is at a program value, and Vplate is at a program value. RAS\ and CAS\ signals are shown in FIG. 3. The other pins are at a low state.

Figures 2D, 2E:
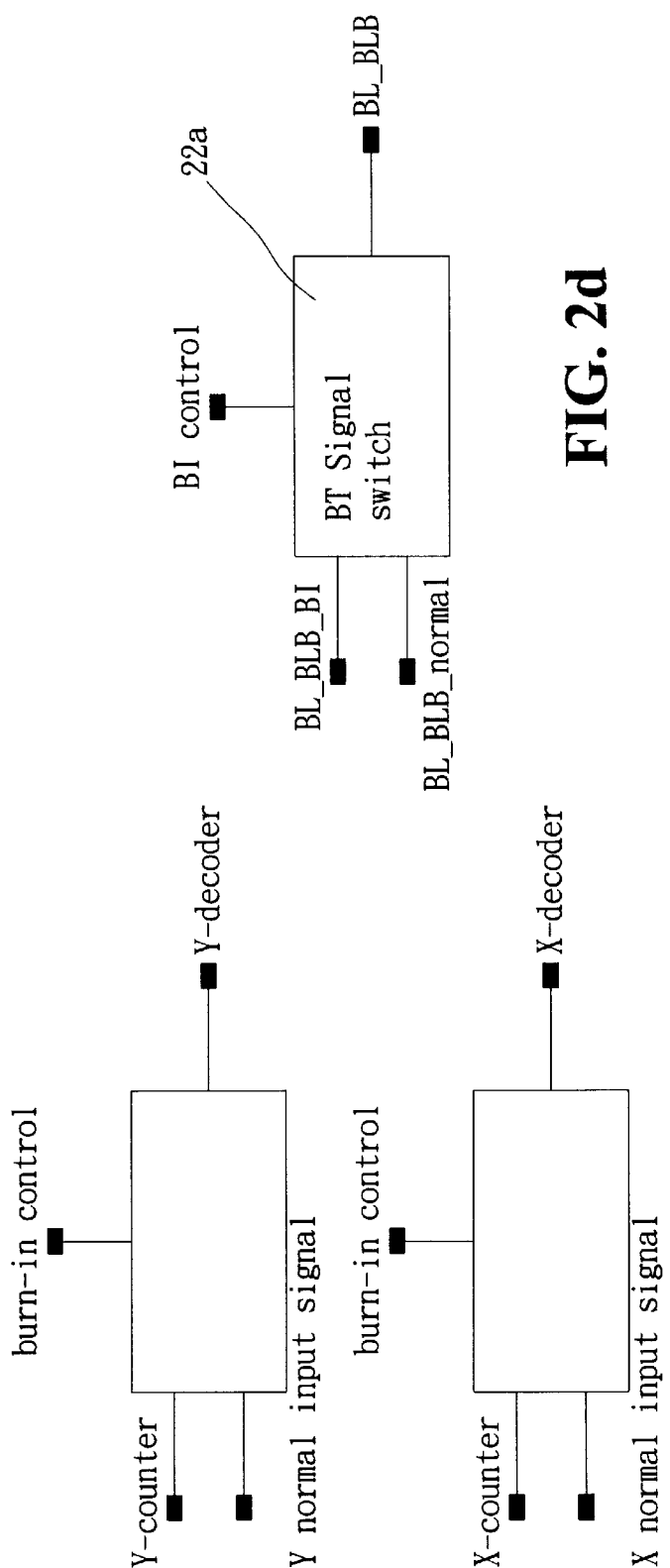
FIG. 2d illustrates an example of the bit-line burn-in control circuit according to the present invention.
FIG. 2e illustrates an example of the main burn-in control circuit according to the present invention.
Figure 2F:
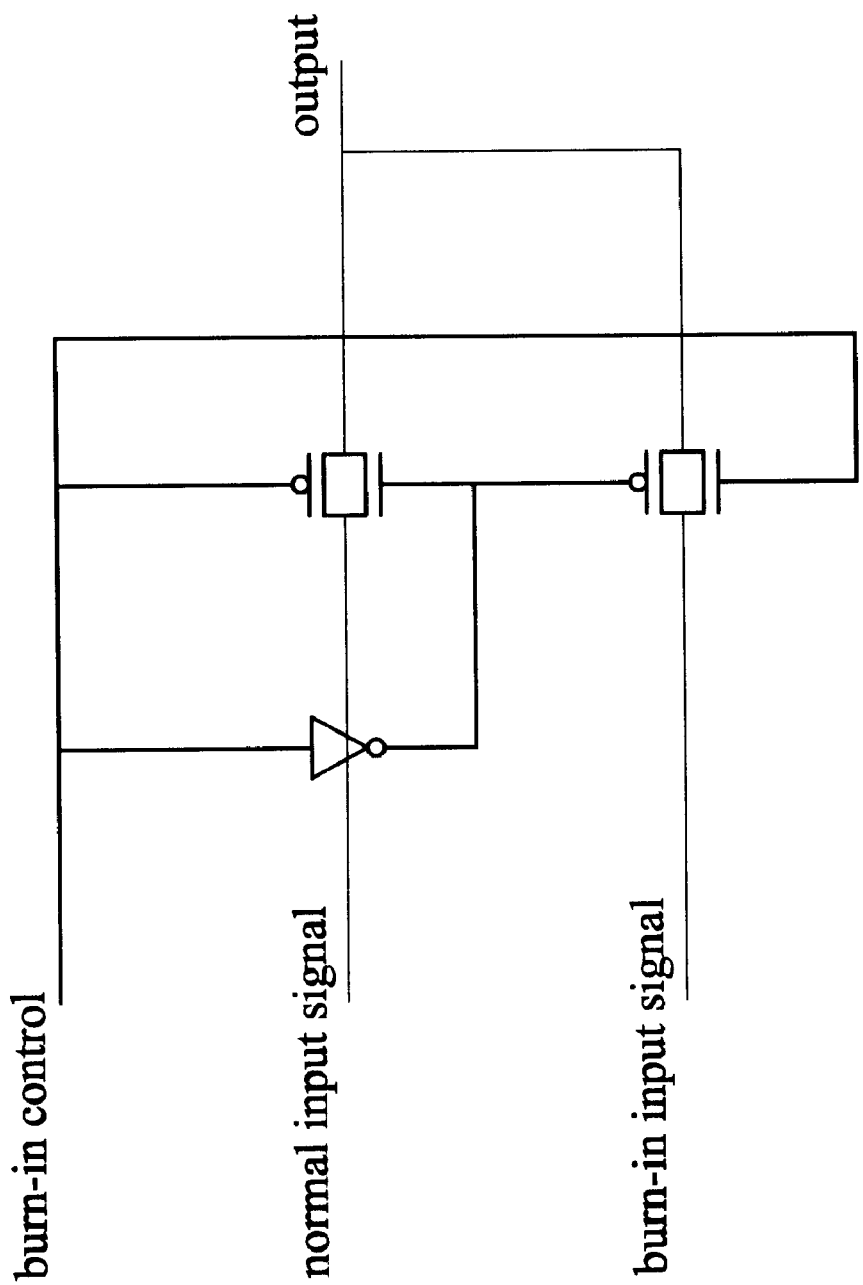
FIG. 2f illustrates an implementation of the circuit for the main burn-in control circuit according to the present invention.

FIG. 2d illustrates an example of the bit line burn-in control circuit 22. The circuit comprises at least one switch 22a. FIG. 2f shows a circuit diagram for an implementation of the bit line burn-in control circuit 22.

The burn-in main control circuit 26 controls the operation of the burn-in of the circuit device. When the input signal at "BI" pad is pulled high, the circuit enters a burn-in mode. The burn-in mode control circuit 26 disables the address pins, I/O pins and WE\ pin so that no problem is introduced to the circuit simply because the inputs have no signals. The circuit enters a static state in which voltages are applied to prepare other control circuits for different burn-in modes. The word line control circuit 22, bit line control circuit 24, internal X refresh counter and the internal Y counter are turned on subsequently. FIG. 2e shows an example of the burn-in main control circuit 26. The circuit comprises a plurality of switches. Each switch may be implemented by the circuit shown in FIG. 2f.

According to the present invention, a special control circuit and a number of internal probing pads are added to an existing integrated circuit, and an external burn-in test system is used to improve the burn-in process of the circuit device. As discussed above, in addition to the existing external probing pads Vcc, GND, RAS\ and CAS\, about 12 to 16 new external probing pads such as BI, Vpp, Vbb, Vint, Vplate, WL, BL, Yic are required.

Figure 4:
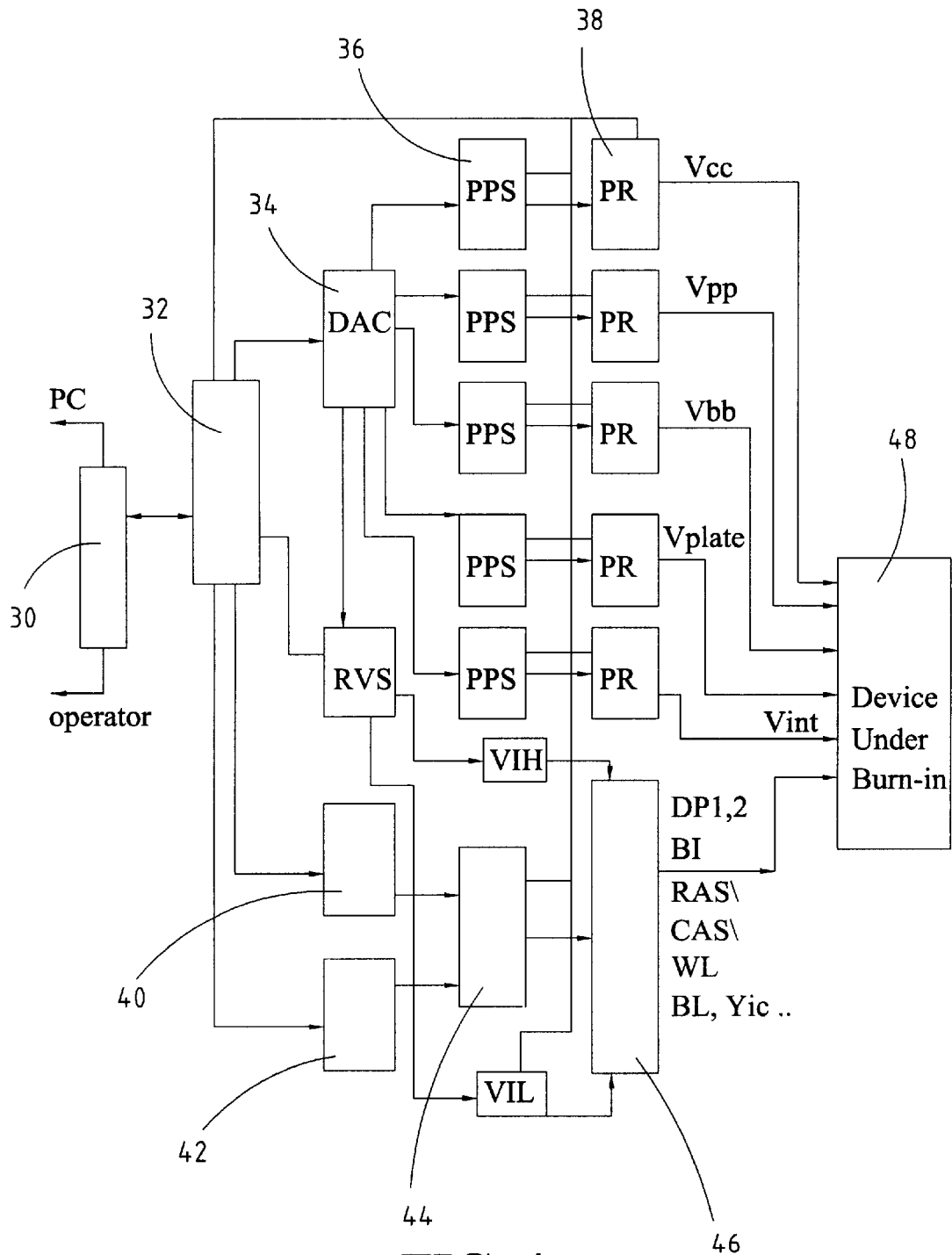
FIG. 4 illustrates the block diagram of a burn-in test system according to the present invention.

As mentioned above, an external burn-in test system is used to provide the necessary signals for the burn-in of an integrated circuit. FIG. 4 shows a burn-in test system according to the present invention. A user enters control signals through a user interface 30 to the controller 32. The control signals are fed into a digital-to-analog converter (DAC) 34. The outputs of the DAC 34 are sent to a plurality of programmable power suppliers (PPS) 36. Each PPS generates a voltage output to a programmable relay (PR) according to its input signal. Each PR has 1 to 32 or 64 channels, current clamps, and voltage regulators, etc. The required voltages Vcc, Vpp, Vbb, Vplate and Vint are generated by PRs according to a desired timing sequence and sent to the device under burn-in 48.

The controller 32 sends an input signal to a reference voltage supplier (RVS) 38 to control the generation of a high input voltage (VIH) and a low input voltage (VIL). It should be noted that the voltage provided by the high and low input voltages must be lower than the breakdown voltage. The high and low voltages turn on or off a memory cell. A timing generator 40 and a pattern generator 42 generate timing signals and patterns that are further formatted by a formatter 44 and sent to the pin electronic card (PIC) 46 to form signals DP1, DP2, BI, RAS\, CAS\, WL, BL and Yic for testing the device under burn-in 48.

In comparison to a conventional burn-in system, the system of the present invention as shown in FIG. 4 has several advantages. It requires less number of pins and simple test patterns. It provides a plurality of programmable power suppliers and can be programmed easily. Multiple dice such as 32 or 64 dice can be under burn-in if a burn-in system as shown in FIG. is used. In addition, the wafer mapping data associated with the burn-in results can be provided to process engineers in real time.

Figure 5:
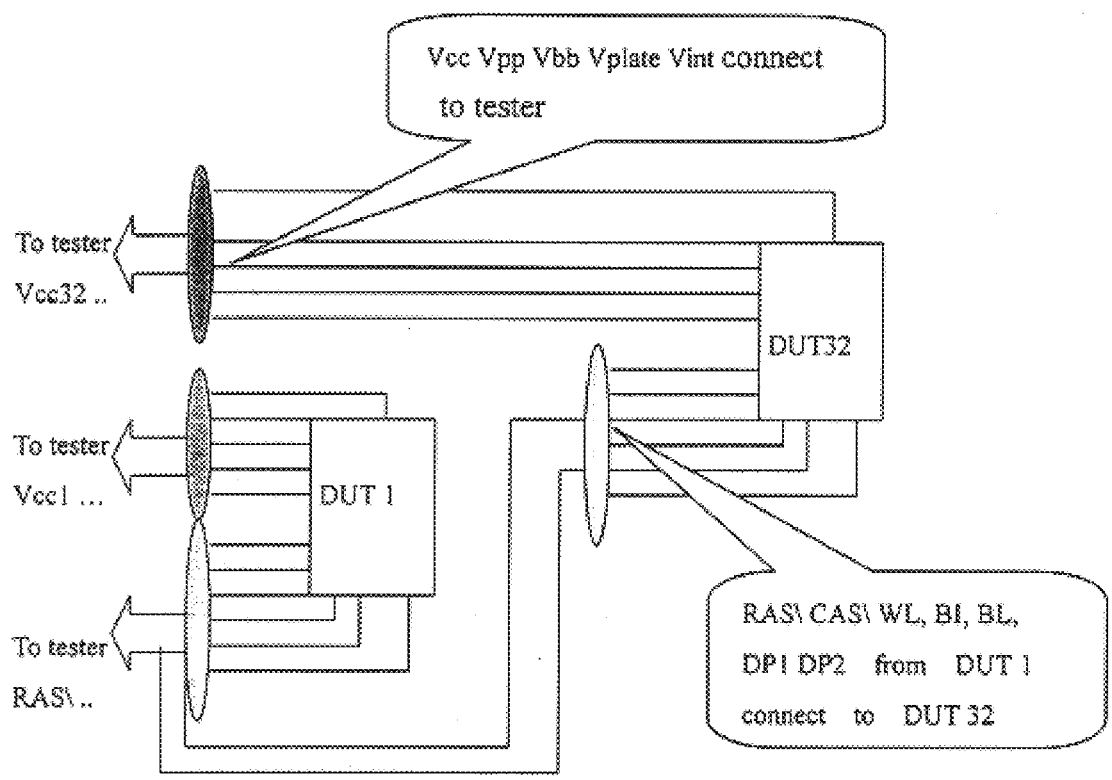
FIG. 5 illustrates how the burn-in test system of the present invention provides control and power signals to a plurality of dice under test.

FIG. 5 illustrates how a plurality of dice are under burn-in simultaneously. 32 or 64 dice may be under burn-in at the same time. As can be seen from FIG. 5, control signals RAS\, CAS\, WL, BI, BL, DP1/2 can be provided by 6 control pins to all dices under test. The power signals Vcc, Vpp, Vbb, Vint, Vplate and Vss, however, have to be provided by power pins to each die under test. For the case of 32 dice, the total number of pins required are 16*32 which are less than 512 pins. Each die is under burn-in independently. Because each die is provided with its own power and can be turned on or off separately, there is no dependence among the dices. No fuse is required in the test board.

Figure 6:
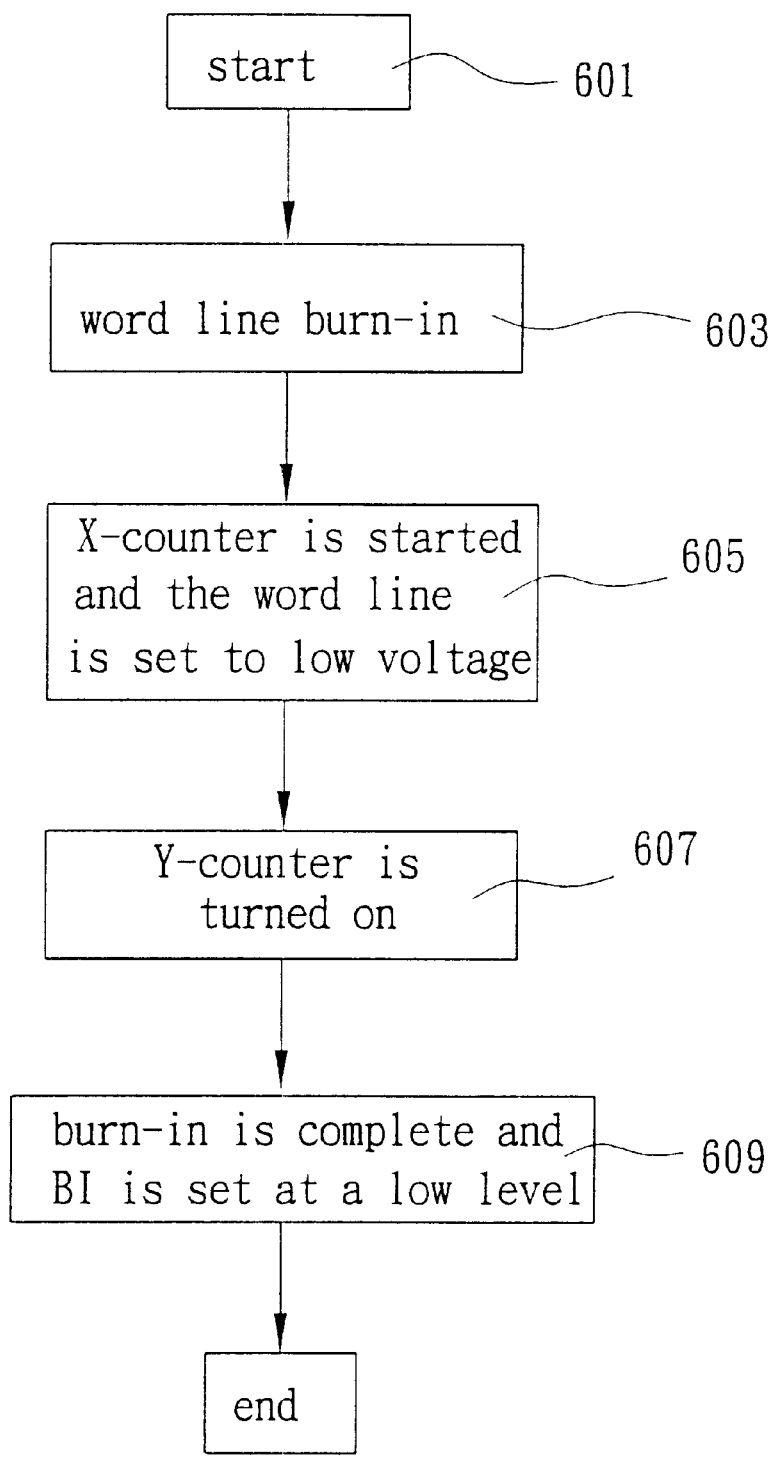
FIG. 6 illustrates the flow chart of the wafer level burn-in according to the invention.

FIG. 6 shows the flow chart of the burn-in process according to the present invention. The circuit starts its operation in burn-in mode 601 with the voltage BI being set at a high level. The address pins to the gate, WE\, OE\ and data I/O are turned off. The system enters a static state in which voltages are applied to prepare for different burn-in modes. The process then starts the word line burn-in 603. The word line is set at a high voltage. The gate oxide is stressed with both Vpp and Vbb at programmed values. The programmed values depend on the break down voltage of the tested device.

In the following step 605, X-counter is started and the word line is set to a low voltage. The bit line is set at a high voltage. In addition, RAS\ and CAS\ change from a high state to a low state. Both Vint and Vplate are set at programmed values. By means of an external programmed value or an internal voltage value, the data is written to the memory cell. CAS\ turns to a low state before the refresh cycle of RAS\. During each cycle, a word line is turned on and the data are written to the memory cells in a page write mode.

In step 607, Y-counter is turned on. Static RAS\ and CAS\ timing sequences are provided. The X-address is provided internally and Y-counter is triggered to write to Y-decoder. Under this condition, both the word line and the bit line are at a low state. RAS\ and CAS\ change from a high state to a low state. Yic is at a high voltage level. Finally, the burn-in is complete and BI is set at a low level.

Figure 7:
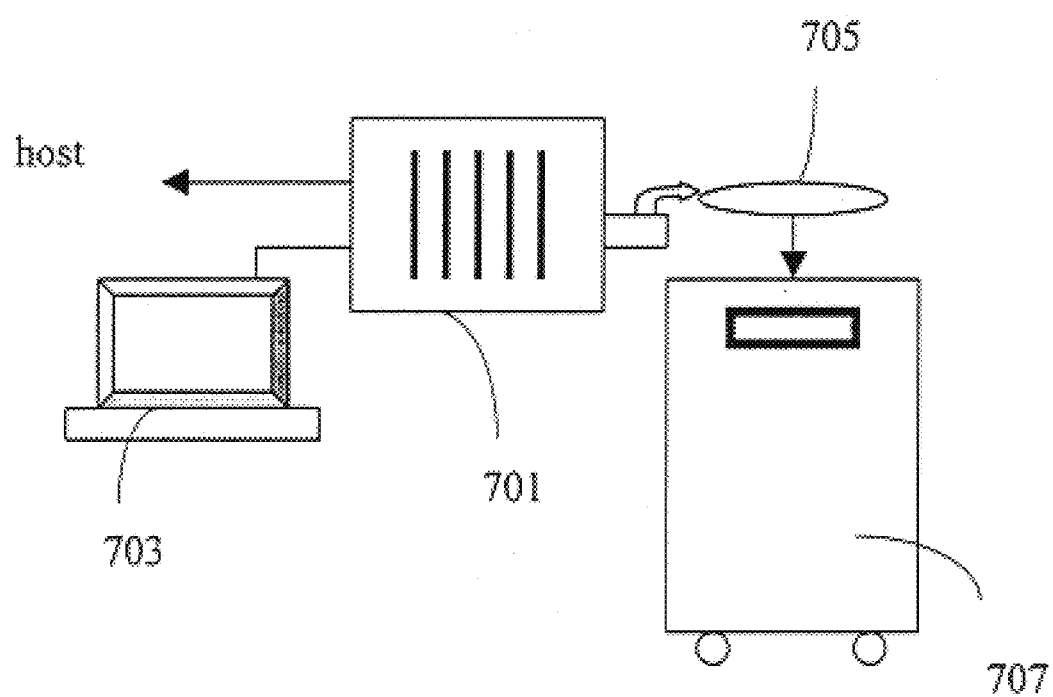
FIG. 7 illustrates an overall wafer level burn-in system according to the invention.

FIG. 7 illustrates the burn-in system according to the invention. A test system 701 controlled by a PC with a keyboard and a monitor as a user interface 703. The test data after burn-in are sent to a main computer for analysis. The test system 701 is connected to a membrane or micro spring probe card 705. 32 or 64 dice can be under burn-in at the same time. A prober 707 provides an automatic probing station with a hot chuck. A wafer is placed on the prober 707 and probed using the membrane or micro spring probe card 705 which sends burn-in signals to the test system.

The burn-in system as shown in FIG. 7 provides separate power to each die. If a die has failed an earlier test, the power to the die can be turned off to skip the burn-in of the die. The system can also accept the wafer mapping data associated with an earlier test to determine which dices should be skipped burn-in. It is not necessary to build a micro fuse into the membrane probe card on each die. The cost of the test system and its maintenance is greatly reduced.

In summary, the method and apparatus of the wafer level burn-in of the present invention have many advantages as compared to the conventional burn-in technology. The wafer level burn-in as described above takes only several ten seconds to several minutes. It can complete burn-in for 32 dice at the same time within 2 to 5 hours. There is no loading and unloading of the dice. The conventional technology would take several hours to several days. In addition, the dices need to be loaded and unloaded in complicated and costly specialized burn-in equipment that has to be tailored to each different die type. The present invention does not require specialized equipment and the burn-in cost is low.

Although only the preferred embodiments of this invention were shown and described in the above description, numerous changes in the detailed construction and combination as well as arrangement of parts may be restored to without departing from the spirit or scope of the invention as hereinafter set forth in the appended claims. It is requested that any modification or combination that comes within the spirit of this invention be protected.

What is claimed is:

1. An apparatus for wafer level burn-in of a memory array having a plurality of memory cells, a plurality of word lines connected to an X-decoder, and a plurality of bit lines connected to a Y-decoder through a plurality of sense amplifiers, said apparatus comprising:

an X-counter connected to said X-decoder;

a Y-counter connected to said Y-decoder;

a row address strobe connected to said X-decoder;

a column address strobe connected to said Y-decoder;

a number of input address pads connected to said row address strobe and said column address strobe;

a word line burn-in control circuit connected to said X-decoder for turning on all word lines in said memory array simultaneously in a burn-in mode;

a bit line burn-in control circuit connected to said Y-decoder for setting all bit lines in said memory array simultaneously in a burn-in mode;

an input buffer connected to said Y-decoder;

an output buffer connected to said Y-decoder;

an input/output interface connected to said input and output buffers; and a main burn-in control circuit for controlling said word line burn-in control circuit, said bit line burn-in control circuit, said X-counter, and said Y-counter.

2. The apparatus as claimed in claim 1, said X-counter being a counter built in said X decoder.

3. The apparatus as claimed in claim 1, said X-counter being an X refresh counter built in said X decoder.

4. The apparatus as claimed in claim 1, said Y-counter being a counter built in said Y decoder.

5. The apparatus as claimed in claim 1, further comprising:

a power supply voltage Vcc;

a row address strobe signal RAS\ for controlling said row address strobe;

a column address strobe signal CAS\ for controlling said column address strobe; and a burn-in mode control signal BI for enabling said apparatus in a burn-in mode;

wherein a gate oxide of each memory cell is put under burn-in test by setting voltages Vpp and Vbb of two internal probing pads across the gate oxide of each memory cell at program values, a word line control signal WL at a high state, RAS\ at a high state, CAS\ at a high state, BI at a high state, and other input pins at a low state.

6. The apparatus as claimed in claim 1, further comprising:

a power supply voltage Vcc;

a row address strobe signal RAS\ for controlling said row address strobe;

a column address strobe signal CAS\ for controlling said column address strobe; and a burn-in mode control signal BI for enabling said apparatus in a burn-in mode;

wherein a capacitor oxide of each memory cell is put under burn-in test by setting voltages Vint and Vplate of two internal probing pads across the capacitor oxide of each memory cell at program values, voltages Vpp and Vbb of two internal probing pads across a gate oxide of each memory cell at a tri-state, a word line control signal WL at a low state, a bit line control signal BL at a high state, BI at a high state, and other input pins at a low state, and then turning on one word line per cycle during a refresh period of a cycle in which CAS\ comes before RAS\ for writing data to all memory cells of the word line being turned on at the same time in a page mode.

7. The apparatus as claimed in claim 6, said X-counter being an X refresh counter built in said X decoder and said X refresh counter turning on one word line per cycle for writing data to all memory cells of the word line being turned on.

8. The apparatus as claimed in claim 1, further comprising:

a power supply voltage Vcc;

a row address strobe signal RAS\ for controlling said row address strobe;

a column address strobe signal CAS\ for controlling said column address strobe; and a burn-in mode control signal BI for enabling said apparatus in a burn-in mode;

wherein a capacitor oxide of each memory cell is put under burn-in test by setting voltages Vint and Vplate of two internal probing pads across the capacitor oxide of each memory cell at program values, voltages Vpp and Vbb of two internal probing pads across a gate oxide of each memory cell at a tri-state, a word line control signal WL at a high state, a bit line control signal BL at a high state, BI at a high state, and other input pins at a low state, and then turning on all word lines one cycle at the same time for writing data to all memory cells of all word lines being turned on at the same time in one cycle.

9. An architecture for wafer level burn-in comprising a burn-in test system with an apparatus as claimed in claim 1, a membrane or micro spring probe card connected to said burn-in test system, and a prober controlling a wafer probed by said membrane or micro spring probe card.

10. The architecture for wafer level burn-in as claimed in claim 9, said prober comprising a hot chuck, said wafer sitting on said hot chuck.

11. The architecture for wafer level burn-in as claimed in claim 9, said membrane or micro spring probe card comprising a plurality of control probing pins and a plurality of groups of power probing pins connected to a plurality of dice under test, said control probing pins being shared by all dice and each group of power probing pins are connected to a die.

12. The architecture for wafer level burn-in as claimed in claim 11, said control probing pins providing a raw address strobe signal RAS\, a column address strobe signal CAS\, a word line control signal WL, a burn-in mode signal BI, a bit-line control signal BL, a DP1/2 control signal, and each group of power probing pins providing power signals Vcc, Vpp, Vbb, Vss, Vint, and Vplate, wherein each die can be put under burn-in separately.

13. The architecture for wafer level burn-in as claimed in claim 11, wherein the number of control probing pins is 6 and the number of each group of power probing pins is 6.

14. An architecture for wafer level burn-in comprising:

a burn-in test system;

a membrane or micro spring probe card connected to said burn-in test system;

a prober controlling a wafer probed by said membrane or micro spring probe, said wafer having a device under test, said device including a memory array having a word line burn-in control circuit for turning on all word lines in said memory array simultaneously in a burn-in mode and a bit line burn-in control circuit for setting all bit lines in said memory array simultaneously in a burn-in mode; and a personal computer with a user input interface and a display for controlling and assisting said burn-in system.

15. A wafer level burn-in test system, comprising:

a user interface;

a controller connected to said user interface;

a digital to analog converter connected to said controller for converting control signals to analog signals;

a plurality of programming power supplies each receiving an analog signal from said digital to analog converter and generating a power voltage;

a device under test, said device including a memory array having a word line burn-in control circuit for turning on all word lines in said memory array simultaneously in a burn-in mode and a bit line burn-in control circuit for setting all bit lines in said memory array simultaneously in a burn-in mode;

a plurality of programming relays each relaying a power voltage to said device under test;

a pin electronic card;

a reference voltage supplier connected to said controller for controlling a high input voltage and a low input voltage sent to said pin electronic card;

a timing generator for generating a timing clock signal;

a pattern generator for generating patterns; and a formatter receiving said timing clock signal and said patterns for controlling said pin electronic card.

16. A method for wafer level burn-in of a memory array having a plurality of memory cells, a plurality of word lines, and a plurality of bit lines, comprising the steps of:

entering a burn-in mode by setting a burn-in control signal to a high state;

turning off address, write enable, output enable and data input/output signals;

executing word line burn-in test by setting a word line control signal WL at a high state and applying voltages Vpp and Vbb of two internal probing pads across a gate oxide of each memory cell at program values; and executing bit line burn-in test by setting said word line control signal WL at a low state, a bit line control signal BL at a high state, voltages Vint and Vplate of two internal probing pads across a capacitor oxide of each memory cell at program values, voltages Vpp and Vbb of two internal probing pads across a gate oxide of each memory cell at a tri-state, and then starting an X counter for turning on one word line per cycle during a refresh period of a cycle in which a column address strobe signal CAS\ comes before a row address strobe signal RAS\ for writing data to all memory cells of the word line being turned on at the same time in a page mode;

wherein said bit line control signal BL at a high state sets all bit lines in said memory array simultaneously for burn-in test.

17. A method for wafer level burn-in of a memory array having a plurality of memory cells, a plurality of word lines, and a plurality of bit lines, comprising the steps of:

entering a burn-in mode by setting a burn-in control signal to a high state;

turning off address, write enable, output enable and data input/output signals;

executing word line burn-in test by setting a word line control signal WL at a high state and applying voltages Vpp and Vbb of two internal probing pads across a gate oxide of each memory cell at program values; and executing bit line burn-in test by setting said word line control signal WL at a high state, a bit line control signal BL at a high state, voltages Vint and Vplate of two internal probing pads across a capacitor oxide of each memory cell at program values, voltages Vpp and Vbb of two internal probing pads across a gate oxide of each memory cell at a tri-state, and then turning on all word lines one cycle at the same time for writing data to all memory cells of all word lines being turned on at the same time in one cycle;

wherein said bit line control signal BL at a high state sets all bit lines in said memory array simultaneously for burn-in test.

* * * * *